United States Patent
Tokunaga

(10) Patent No.: US 7,077,173 B2
(45) Date of Patent: Jul. 18, 2006

(54) WAFER CARRIER, WAFER CONVEYING SYSTEM, STOCKER, AND METHOD OF REPLACING GAS

(75) Inventor: Kenji Tokunaga, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 696 days.

(21) Appl. No.: 10/191,802

(22) Filed: Jul. 10, 2002

(65) Prior Publication Data

US 2003/0009904 A1    Jan. 16, 2003

(30) Foreign Application Priority Data

Jul. 13, 2001    (JP)    ............... 2001-213943
Aug. 1, 2001    (JP)    ............... 2001-233960

(51) Int. Cl.
    *B65B 1/04*    (2006.01)
(52) U.S. Cl. ..................... 141/66; 141/98; 414/937; 414/939
(58) Field of Classification Search .............. 141/98, 141/65–67, 59; 414/804, 805, 147, 939, 414/937
See application file for complete search history.

(56) References Cited

U.S. PATENT DOCUMENTS 5,217,053 A * 6/1993 Foster et al. ................ 141/98
6,092,980 A * 7/2000 Kumasaka et al. ......... 414/804

FOREIGN PATENT DOCUMENTS

| JP | 5-326679 | 5/1992 |
| JP | 04-294766 | 10/1992 |
| JP | 11-168135 | 6/1999 |
| JP | 11-307623 | 11/1999 |

* cited by examiner

Primary Examiner—Steven O. Douglas
(74) Attorney, Agent, or Firm—Foley & Lardner LLP

(57) ABSTRACT

When atmosphere inside a wafer carrier is replaced by introducing a gas into the wafer carrier from a gas inlet provided to the wafer carrier that can accommodate wafers. At the same time, the atmosphere inside the wafer carrier is sucked to make an inside pressure negative relative to an outside pressure.

4 Claims, 10 Drawing Sheets

WAFER CARRIER, WAFER CONVEYING SYSTEM, STOCKER, AND METHOD OF REPLACING GAS

BACKGROUND OF THE INVENTION

1. Field of the Invention

The present invention relates to a wafer carrier, a wafer conveying system, a stocker, and a method of replacing gas.

2. Background Art

The present invention typically relates to a sealed-type wafer carrier for accommodating and carrying wafers in the manufacture of semiconductor devices, and to stocking and conveying of the wafer carrier. The present invention will be described below exemplifying the case of the manufacture of a semiconductor device.

FIG. 8 is a perspective view for illustrating a known wafer carrier of a side-door integrated type used at the time of manufacturing the semiconductor device, and FIG. 9 is a perspective view illustrating an inside of the door of the wafer carrier. FIG. 10 is a sectional view illustrating the wafer carrier placed on a table of a wafer processing apparatus and accommodating wafers.

Wafer carriers include, for example, a wafer carrier described in a catalog made by FLUOROWARE Company. This type of wafer carrier is referred to as FOUP in the SEMI Standards. A conventional wafer carrier will be described below exemplifying an FOUP.

FOUP is the abbreviation of a "Front Opening Unified Pod". Detailed information, such as dimensions, is described in the SEMI Standards E 52, E 1.9, or E 47.1.

In FIG. 8, reference numeral 100 denotes a wafer carrier, and the wafer carrier 100 has a carrier shell 10 and a carrier door 20. The carrier shell 10 is a housing having an open face in one surface, and the carrier door 20 fits to the carrier shell 10 at this open face. In the state where the carrier door 20 fits to the carrier shell 10, that is, in the state where the carrier door 20 is closed, the wafer carrier 100 is in a sealed state.

As FIG. 9 shows, a sealing material (packing) 21 is provided on the surface where the carrier door 20 contacts the carrier shell 10. This sealing material (packing) 21 is provided so as to maintain air-tightness between the carrier door 20 and the carrier shell 10.

Wafers are accommodated in the above-described wafer carrier 100, and conveyed automatically, for example, with an automatic transfer system called an OHT (overhead hoist transport) together with the wafer carrier 100 to a wafer processing apparatus that performs required processing.

In general, the wafer processing apparatus is installed in a room known as a clean room where temperature and humidity are controlled, and dust is eliminated. Therefore, the wafers are also conveyed in this clean room.

The reason why wafers are accommodated in an airtight carrier, and conveyed and processed in a clean room is to protect the wafers from foreign matter in the atmosphere and chemical contamination.

The carrier shell 10 and the carrier door 20 of the wafer carrier 100 are generally formed of a high-performance plastic material. However, plastic materials have a property to permeate moisture or the like. Thus, even if the wafer carrier 100 is in a sealed state, moisture or the like may enter inside the wafer carrier 100.

On the other hand, the atmospheric air may permeate into the wafer carrier 100 from the sealing material (packing) 21 used for maintaining the air-tightness of the wafer carrier 100 due to molecular diffusion or the like.

Therefore, the humidity, oxygen content, or the like in the wafer carrier 100 tend to increase with the lapse of time.

Also, when wafers whereto a photoresist is applied are stocked in the wafer carrier 100, the organic solvent vaporized from the photoresist applied to the wafers may adhere to the internal wall of the wafer carrier 100. In this case, even after the wafers whereto the photoresist is applied are removed, the organic solvent adhered to the internal wall of the wafer carrier 100 may remain intact. Thereafter, by the re-vaporization of the organic solvent, the atmosphere inside the water carrier 100 may be contaminated by organic compounds.

As a measure against such elevations of humidity and oxygen content, and organic contamination in a wafer carrier 100, there has been proposed a method of introducing $N_2$ or dry air from the bottom of the wafer carrier 100 to replace the atmosphere inside the wafer carrier 100.

However, as FIG. 10 shows, a plurality of wafers 40 are horizontally accommodated in the wafer carrier 100. If $N_2$ gas is simply introduced from the bottom of the wafer carrier 100 in this state, wafers 40 or the like accommodated in the wafer carrier 100 interfere with $N_2$ gas to diffuse throughout the wafer carrier 100.

When the atmosphere inside the wafer carrier 100 is replaced, $N_2$ gas for replacement is usually introduced from the bottom of the wafer carrier 100. This is due to ease of the placement of piping required for flowing the gas for replacement and discharging the inside atmosphere. However, when the gas for replacement is introduced from the bottom, it is feared that foreign matter deposited on the bottom may be blown up.

As described above, even if the wafer carrier is airtight, outside air or moisture permeates due to the characteristics of plastics or rubber, and humidity or oxygen content inside the wafer carrier may increase. Also, by accommodating wafers whereto a photoresist is applied are stocked, the atmosphere inside the wafer carrier may be contaminated by organic compounds.

Even if $N_2$ gas or dry air is simply introduced into the wafer carrier to solve the problems above, obstructs in the wafer carrier, such as wafers, make it difficult to replace the atmosphere inside the wafer carrier with a clean gas in a short time.

Furthermore, when $N_2$ gas or dry air is introduced from the bottom of the wafer carrier, foreign matter deposited on the bottom may be blown up to contaminate the atmosphere inside the wafer carrier.

However, the elevation of humidity or oxygen content in the wafer carrier, or the contamination of the wafer carrier by the organic solvent and foreign matter raises problems of the growth of natural oxide films, and poor gate oxide integrity.

Therefore, in order to solve these problems, an object of the present invention is to provide a wafer carrier, a wafer conveying system, a stocker, and a method of replacing gas that can replace the atmosphere inside the wafer carrier efficiently in a short time while preventing the mixing of foreign matter.

SUMMARY OF THE INVENTION

According to one aspect of the present invention, a wafer carrier for accommodating wafers therein comprises a housing having an open surface on one side, a door fitting to the housing on the open surface, a gas inlet for introducing a gas for replacing atmosphere inside the wafer carrier, and a gas suction port for sucking the atmosphere inside the wafer carrier.

In another aspect of the present invention, a wafer conveying system comprises a wafer carrier of the present invention, and a load port device for conveying wafers accommodated inside the wafer carrier to the wafer processor for providing waters with a predetermined processing. The load port device comprises gas sucking means connected to the gas suction port for sucking the atmosphere inside the wafer carrier.

In another aspect of the present invention, a stocker for stocking a wafer carrier accommodating wafers, comprises a table portion for placing the wafer carrier, and gas suction means connected to a gas suction port provided to the wafer carrier, for sucking the atmosphere inside the wafer carrier.

In another aspect of the present invention, in a method of replacing atmosphere inside a wafer carrier by introduce a gas into an inside of the carrier from a gas inlet provided to the wafer carrier accommodating wafers, the atmosphere inside the wafer carrier is sucked to make the inside pressure negative. A gas outside the wafer carrier is introduced to inside the wafer carrier.

Other and further objects, features and advantages of the invention will appear more fully from the following description.

DETAILED DESCRIPTION OF THE PREFERRED EMBODIMENTS

Figure 1:
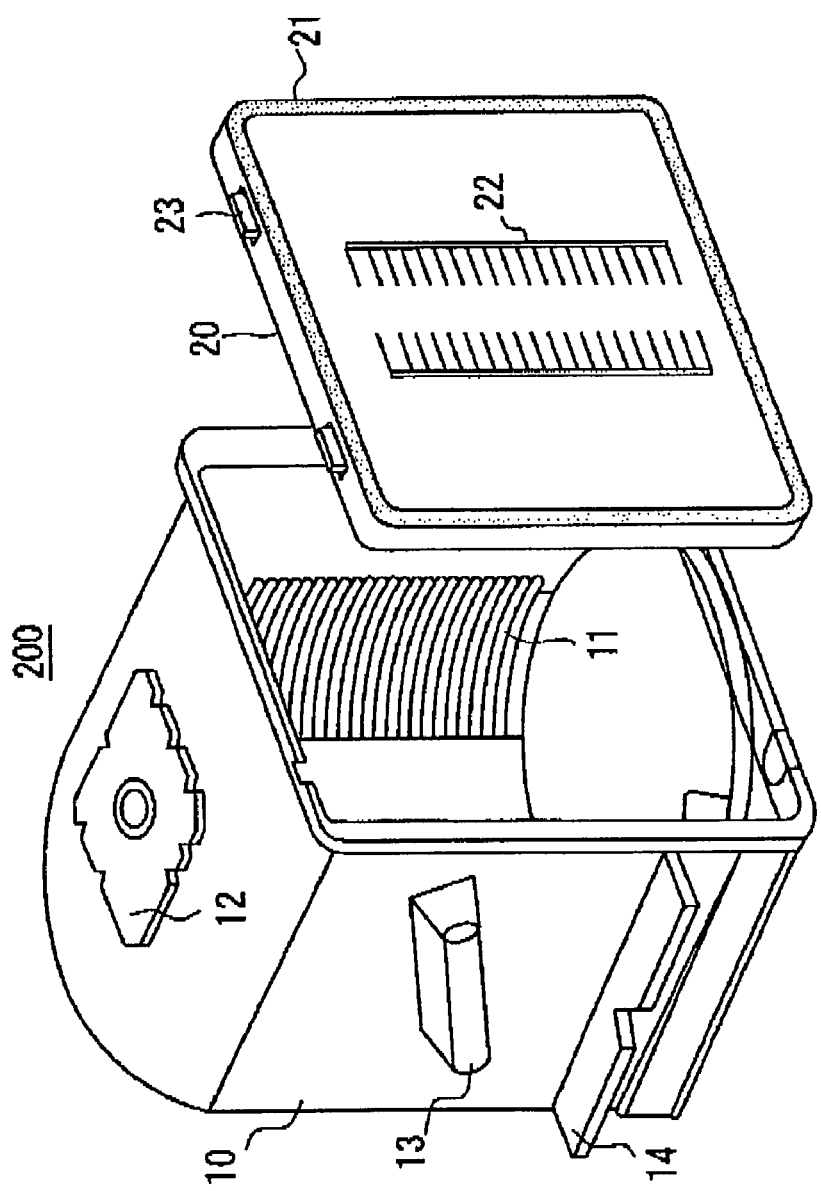
FIG. 1 is a perspective view illustrating a wafer carrier used in First Embodiment.

The embodiments of the present invention will be described below referring to the drawings. In each of the drawings, the same or equivalent parts will be denoted with the same reference numerals, and the description thereof will be omitted or simplified.

First Embodiment

In First Embodiment of the present invention, in order to replace atmosphere inside a wafer carrier, the atmosphere inside the wafer carrier is previously sucked before introducing a gas for replacement into the wafer carrier. By thus making inside of the wafer carrier negative relative to the outside atmospheric pressure, the replacement by the gas can be achieved efficiently in a short time. This will be described below referring to the drawings.

Figure 2A:
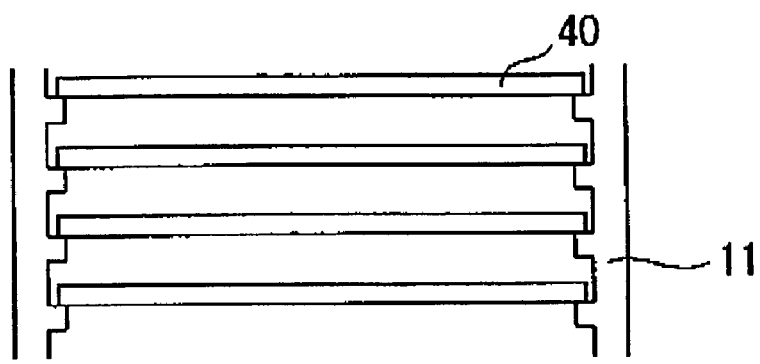
FIG. 2A and 2B are diagrams illustrating the state where wafers are held in the wafer carrier in First Embodiment.
Figure 2B:
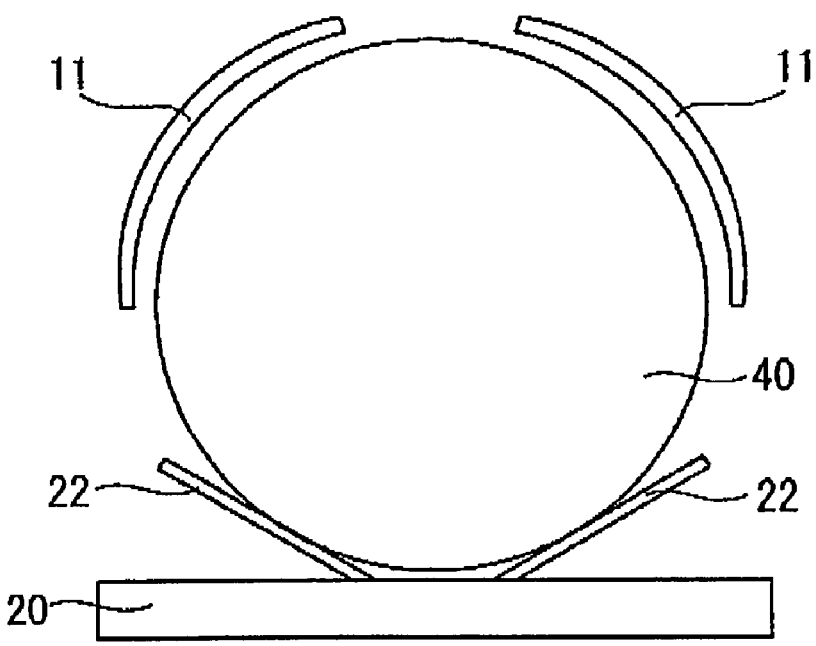

FIG. 1 is a perspective view illustrating a wafer carrier used in First Embodiment. FIG. 2 is a diagram illustrating the state where wafers are held in the wafer carrier, in which FIG. 2A is a perspective view from the side, and FIG. 2B is a perspective view from the top.

In FIG. 1, reference numeral 200 denotes a wafer carrier, and in First Embodiment, an FOUP of the SEMI Standards is used. The appearance of the wafer carrier 200 is identical as the conventional wafer carrier 100 illustrated in FIG. 8.

In FIG. 1, reference numeral 10 denotes a carrier shell, and 20 denotes a carrier door. However, in FIG. 1, the carrier door 20 is separated from the carrier shell 10. and the inside of the carrier door 20 is shown.

The carrier shell 10 is a housing having an open face in a part thereof, and the carrier door 20 is a door that is fitted to the carrier shell 10 at this open face. The carrier shell 10 and the carrier door 20 are formed of a high-performance plastic material. By opening and closing the carrier door 20, wafers can be accommodated inside the wafer carrier 200.

Reference numeral 21 denotes a sealing material (packing), and 23 denotes a latch of a clamping mechanism. The sealing material (packing) 21 is installed on the surface where the carrier door 20 contacts the carrier shell 10, and is adopted to maintain air-tightness between the carrier shell 10 and the carrier door 20. The sealing material (packing) 21 is generally made of a rubber material. The latches 23 of the clamping mechanism fit in holes (not shown) formed on the carrier shell 10, and is adopted to fix the carrier door 20 in the state where the carrier door 20 is fitted to the carrier shell 10.

Reference numeral 11 denotes wafer teeth provided on the internal wall of the carrier shell 10, and 22 denotes retainers provided on the inside of the carrier door 20. As FIGS. 2A and 2B show, a plurality of wafers 40 which are accommodated in the wafer carrier 200 are hold by the wafer teeth 11 and the retainers 22 of the shapes of shelves, and arranged horizontally.

Referring to FIG. 1, reference numeral 12 denotes a robot flange, 13 denotes manual handles, and 14 denotes side rails for conveying the wafer carrier 200. These are provided on the outside of the carrier shell 10.

Figure 8:
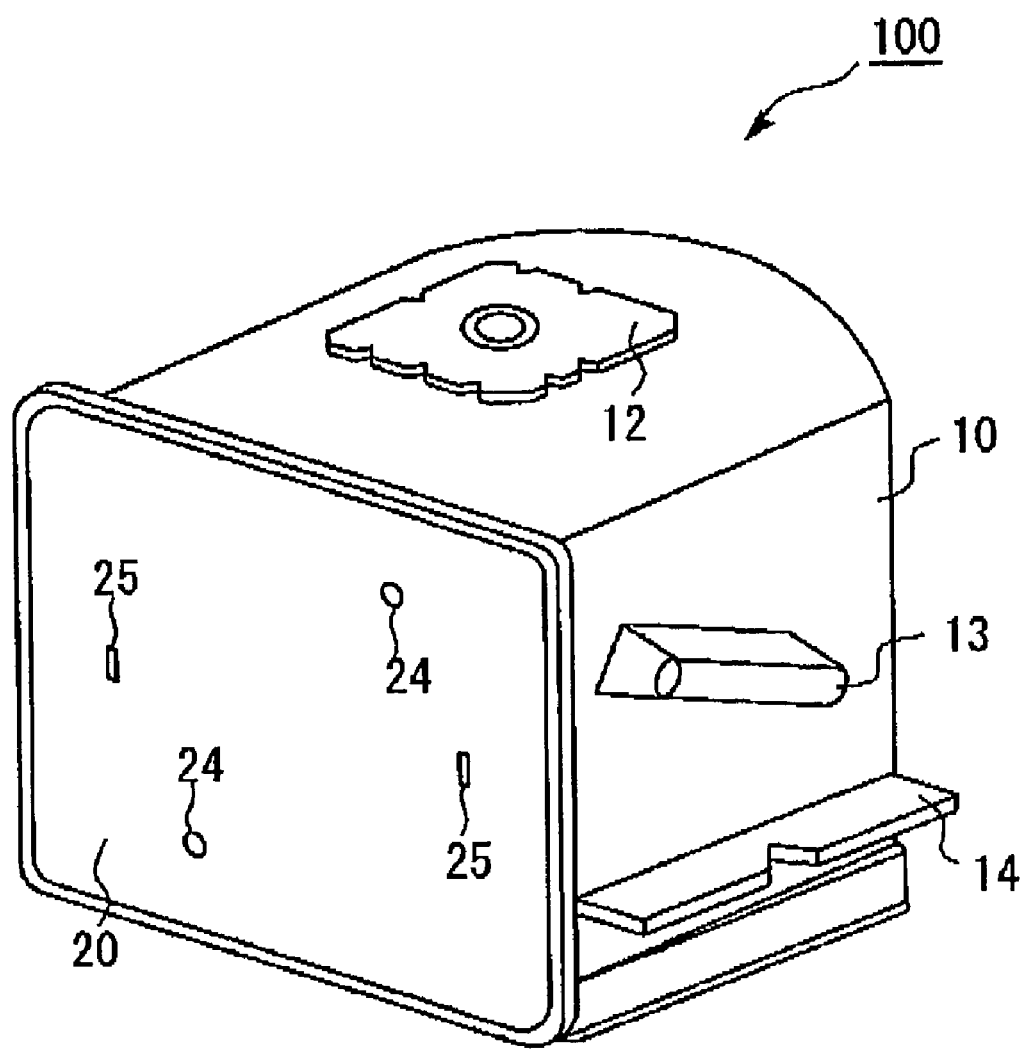
FIG. 8 is a perspective view for illustrating a known wafer carrier of a side-door integrated type used at the time of manufacturing the semiconductor device.
Figure 9:
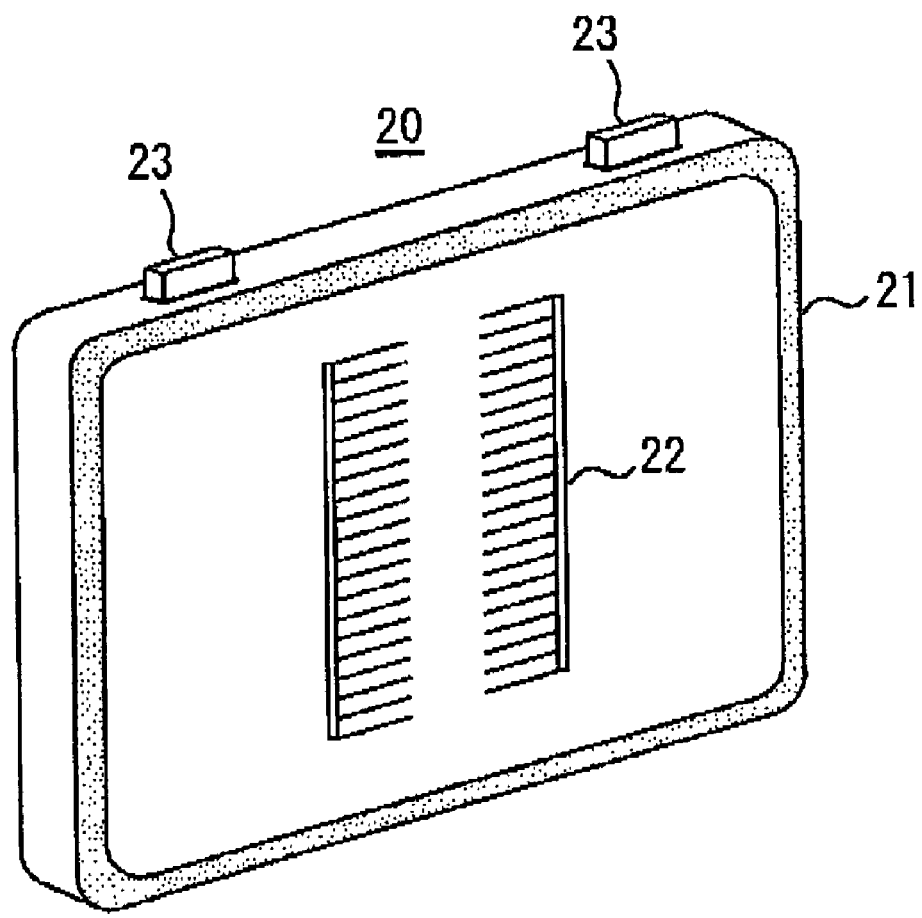
FIG. 9 is a perspective view illustrating an inside of the door of the wafer carrier.
Figure 10:
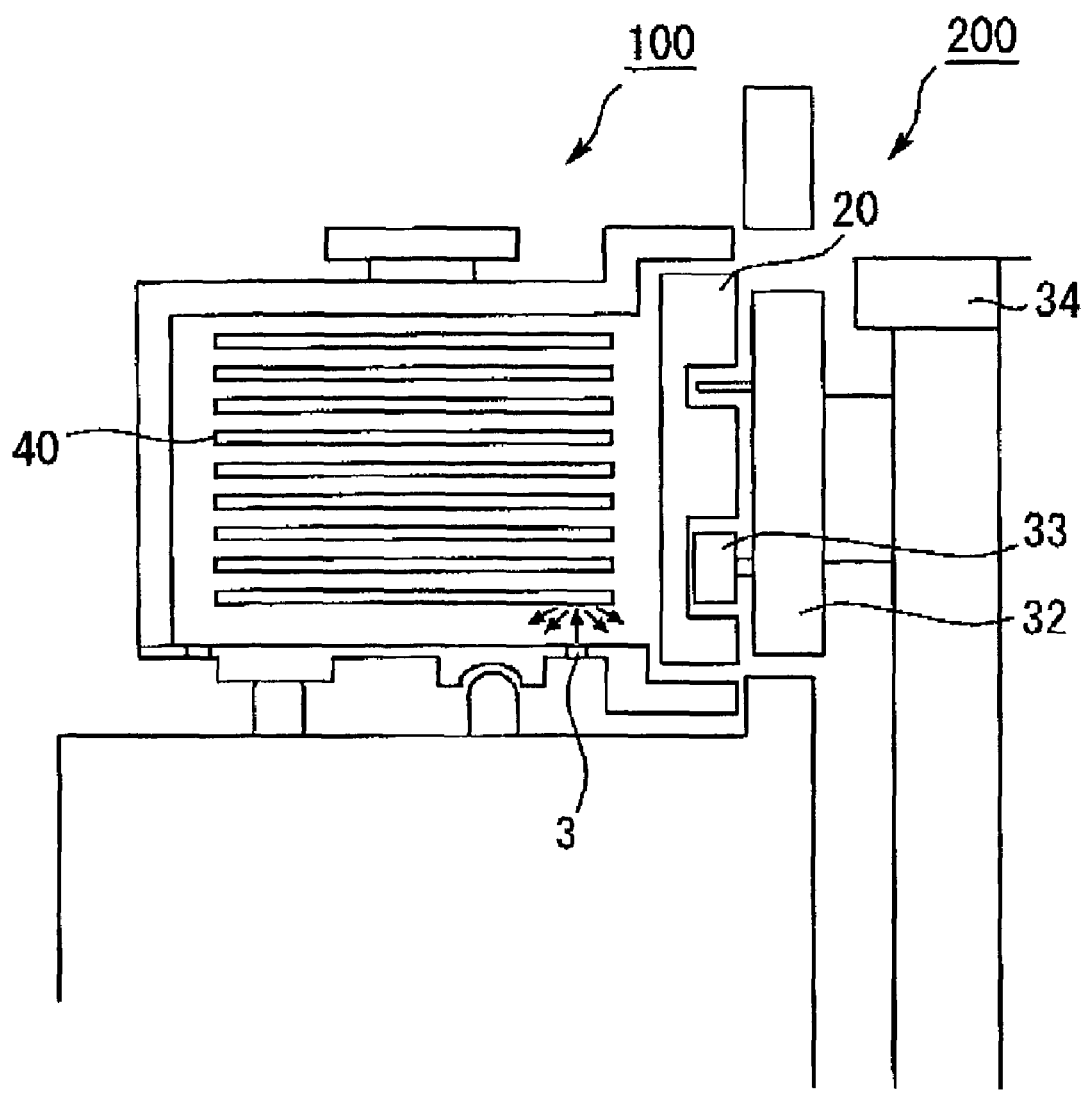
FIG. 10 is a sectional view illustrating the wafer carrier placed on a table of a wafer processing apparatus and accommodating wafers.

On the outer surface of the carrier door 20 are provided a registration-pin hole 24 and a latchkey hole 25 similar to those of the conventional wafer carrier 100 shown in FIG. 8. The registration-pin hole 24 is used for registration, and the latchkey hole 25 is used for opening and closing the carrier door 20. These will be described later.

Figure 3:
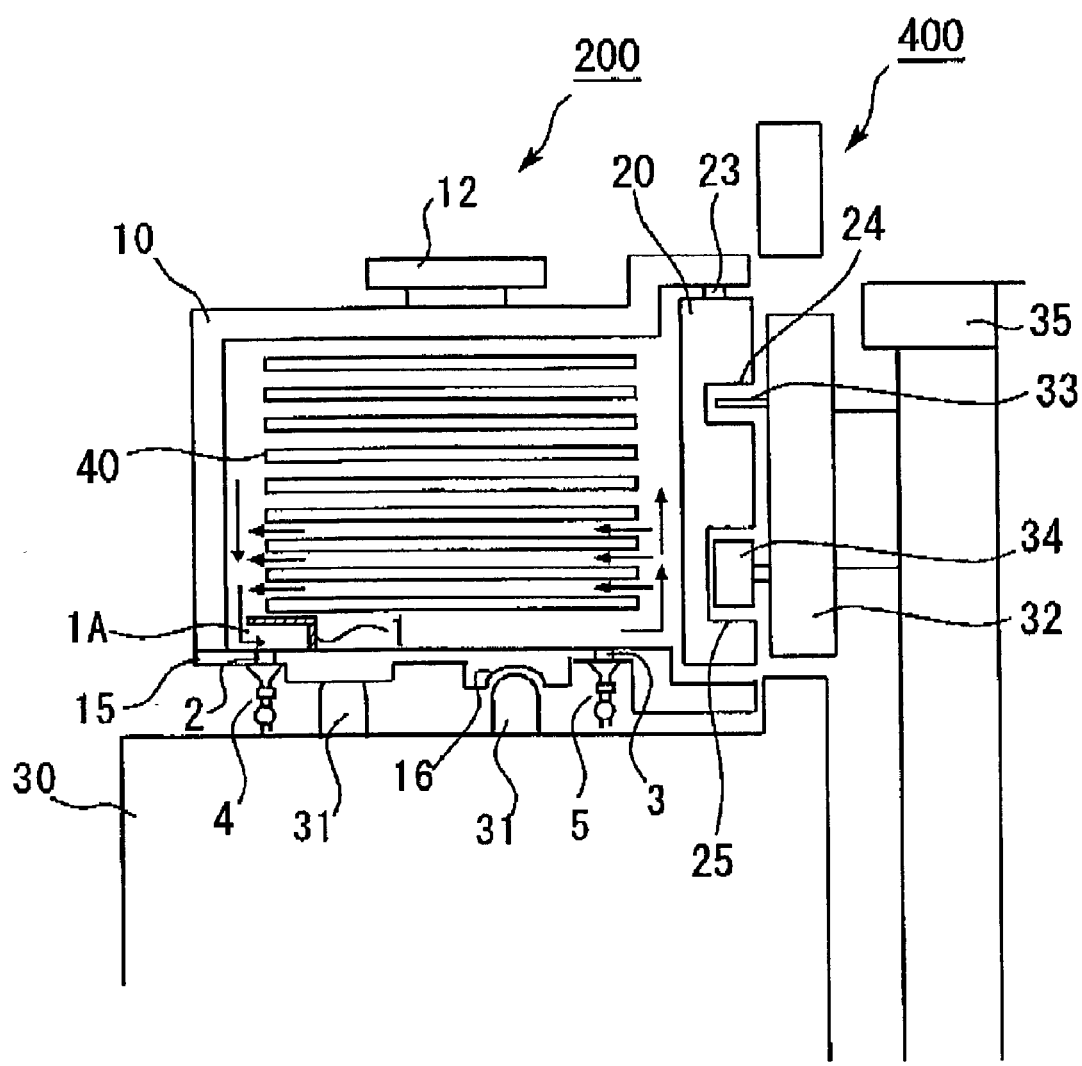
FIG. 3 is a sectional view illustrating the wafer carrier placed on the table of a water processing apparatus in First Embodiment.

FIG. 3 is a sectional view illustrating the wafer carrier 200 placed on the table of a wafer processing apparatus.

In FIG. 3, reference numeral 400 denotes a load port apparatus provided to the wafer processing apparatus.

Reference numeral 32 denotes a load port door. The load port door 32 constitutes a part of the wall of the wafer processing apparatus. Here, since an FOUP is used as the wafer carrier 200, the wall surface of the wafer processing apparatus constitutes an FIMS surface corresponding to the FOUP.

Reference numeral 33 denotes a registration pin, and 34 denotes a latchkey, both of which are provided on the surface of the load port door 32. The registration pin 33 is used for registration by inserting into the registration-pin hole 24 provided on the carrier door 20. The latchkey 34 is used to release the latch 23 for the clamping mechanism from the carrier shell 10 by inserting into the latchkey hole 25 and turning, whereby the carrier door 20 can be opened.

Reference numeral 35 denotes a mapper, which is used to check the presence or absence of wafers inside of the wafer carrier 200, and to measure the levels and positions of the wafers.

Reference numeral 30 denotes a table, and 31 denotes a kinematic pin protruded on the table 30. Reference numeral 15 denotes a base plate, which is the bottom of the wafer carrier 200, and 16 denotes a V-groove provided on the base plate 15. The conveyed wafer carrier 200 is placed on the table 30. In this time, the kinematic pin 31 is fit to the V-groove 16 to determine the position of the wafer carrier 200 placed on the load port apparatus 400.

Reference numeral 2 denotes a gas suction port for sucking the atmosphere inside the wafer carrier 200, provided on the base plate 15; and reference numeral 3 denotes a gas inlet for introducing a gas for replacing the gas inside the wafer carrier 200.

Reference numeral 1 denotes deflection means for deflecting a direction of sucking the gas when the gas inside the wafer carrier 200 is sucked, which is a lid that covers the gas suction port 2. Reference numeral 1A denotes an opening of the deflection means 1.

Reference numeral 4 denotes gas suction means. The gas suction means 4 is provided in the load port apparatus 400, and connected to the gas suction port 2 covered with the lid 1 when the gas is sucked.

Reference numeral 5 denotes gas supply means for supplying a gas for replacing the atmosphere inside the wafer carrier 200. The gas supply means 5 is provided in the load port apparatus 400, and connected to the gas inlet 3 when the gas is sucked. In First Embodiment, the gas supply means 5 supplies $N_2$ gas as the gas for replacing the atmosphere inside the wafer carrier 200.

The wafer conveying system is constituted including the wafer carrier 200 and the load port apparatus 400.

Figure 4:
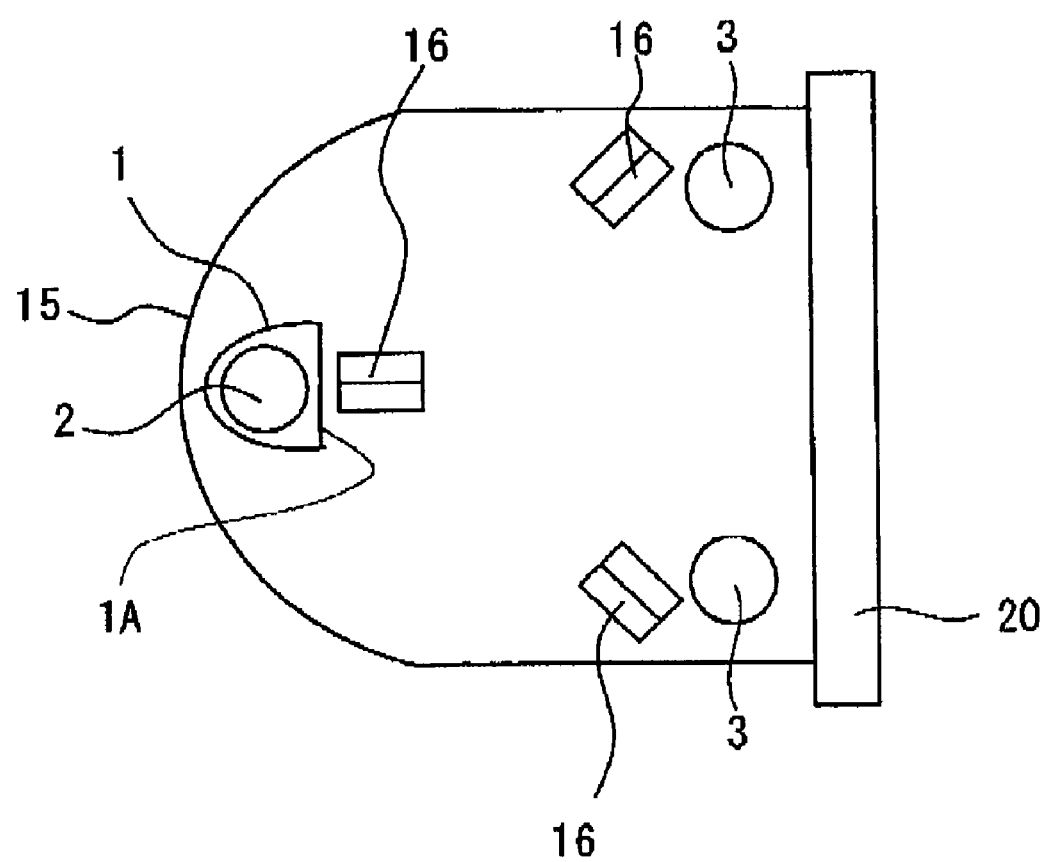
FIG. 4 is a bottom view of the wafer carrier in First Embodiment.

FIG. 4 is a bottom view of the wafer carrier 200. In FIG. 4, the lid 1 is shown as a perspective view, and actually the lid 1 is installed inside the wafer carrier 200. As FIG. 4 shows, the gas suction port 2 is installed facing the carrier door 20 of the base plate 15, on the position apart from the carrier door 20. Two gas inlets 3 are installed apart from each other in the vicinity of the carrier door 20 of the base plate 15.

Figure 5:
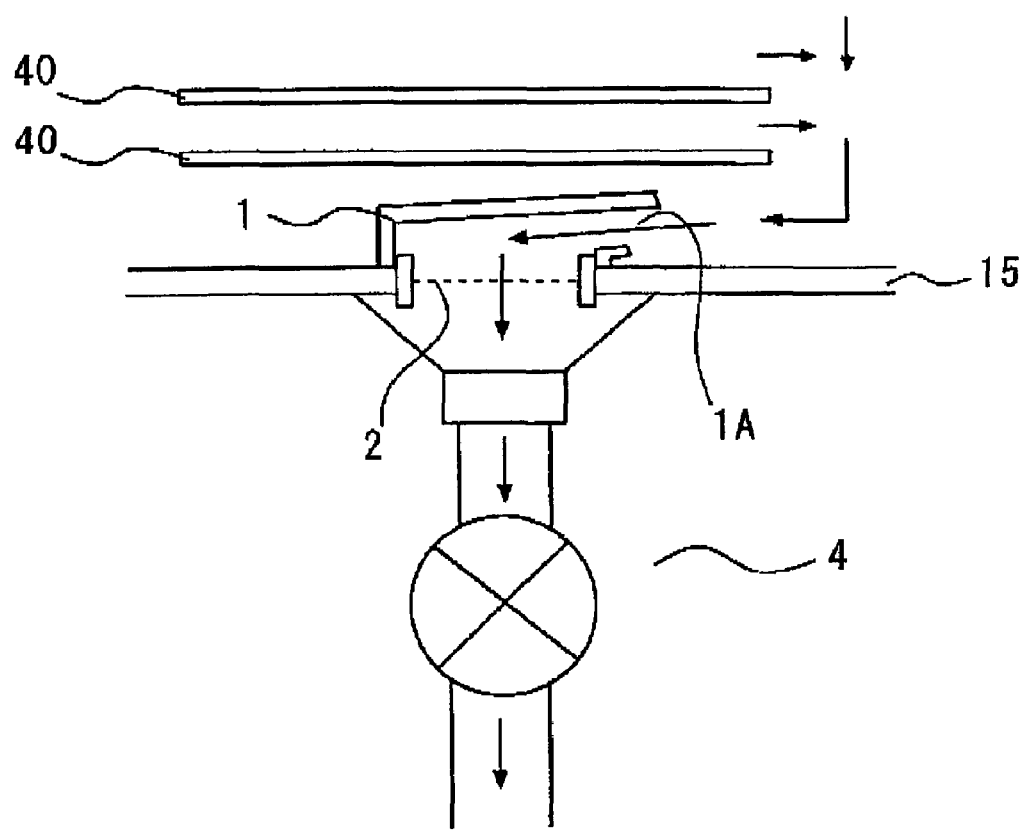
FIG. 5 is an enlarged sectional view of the lid, which is the deflection means used in First Embodiment, and the vicinity thereof.

FIG. 5 is an enlarged sectional view of the lid 1, which is the deflection means used in First Embodiment, and the vicinity thereof.

As shown in FIG. 5, the gas suction port 2 is provided with the lid 1 having an opening 1A in one direction so as to cover the gas suction port 2.

The gas suction means 4 is connected to the gas suction port 2 for sucking the atmosphere inside the wafer carrier 200. In First Embodiment, the gas suction means 4 is provided in the load port apparatus 400, and connected to the gas suction port 2 when the gas is sucked.

When the suction of the gas by the gas suction means 4 begins, the atmosphere inside the wafer carrier 200 is discharged from the opening 1A of the lid 1 installed above the gas suction port 2 deflecting the suction direction as shown by arrows in FIG. 5.

Next, a method of replacing gases according to First Embodiment will be described referring to the drawings.

Prior to gas replacement, first the carrier door 20 of the wafer carrier 200 is opened to accommodate a plurality of wafers 40 in the wafer carrier 200, and the carrier door 20 is closed.

In the wafer carrier 200, as FIGS. 2A and 2B show, a plurality of wafers 40 are held by the wafer teeth 11 and the retainers 22, and are arranged horizontally.

The wafer carrier 200 thus accommodating the wafers 40 is conveyed to the table 30 of the wafer processing apparatus for preliminary washing. Since the gross weight of the wafer carrier 200 becomes 8 kg or more, for example, when 300-mm wafers are accommodated, conveying by hand cannot be considered for the safety point of view. Therefore, automatic conveying using OHT (overhead hoist transport), a RGV (rail guided vehicle), or the like: or manual conveying using a PGV (person guided vehicle) or the like is considered.

As FIG. 3 shows, the wafer carrier 200 is placed on the adequate position of the table 30 of the load port apparatus 400 by fitting the V-groove 16 provided on the base plate 15 to the kinematic pin 31 provided on the table 30.

In this state, the carrier door 20 of the wafer carrier 200 is in contact with the load port door 32 of the load port apparatus 400, and at the same time, the registration pin 33 and the latchkey 34 provided on the load port door 32 are inserted in the registration-pin hole 24 and the latchkey hole 25 provided on the carrier door 20, respectively.

By turning the latchkey 34, the latch 23 for the clamping mechanism is released from the carrier shell 10, whereby the carrier shell 10 is separated from the carrier door 20. In this state, the carrier door 20 is drawn into the mini-environment (not shown) of the load port apparatus.

Thereafter, the wafers 40 accommodated in the wafer carrier 200 are conveyed in the wafer processing apparatus for preliminary washing from the wafer carrier 200, and are preliminarily washed. After the completion of preliminary washing, the wafers 40 are accommodated again in the wafer carrier 200, and the carrier door 20 is closed.

Next, gas replacement inside the water carrier 200 is started.

First, the gas suction means 4 is connected to the gas suction port 2, and the suction of the atmosphere inside the wafer carrier 200 is started.

After the suction of the atmosphere inside the wafer carrier 200 has proceeded, and the pressure inside the wafer carrier 200 has become negative relative to the pressure in the clean room, the gas supply means 5 is connected to the gas inlet 3, and the supply of $N_2$ gas from the gas supply means 5 is started.

$N_2$ gas flows from the gas inlet 3 into the wafer carrier 200 as shown by arrows in FIG. 3. Here, since the pressure of the wafer carrier 200 has become negative by suction, the $N_2$ gas flowing from the gas inlet 3 is efficiently diffused in the entire wafer carrier 200.

At the same time, the atmosphere inside the wafer carrier 200 is discharged toward the gas suction port 2 by the suction of the gas suction means 4. At this time, the direction of suction is deflected in the direction of the opening 1A of the lid 1 by the lid 1 installed above the gas suction port 2, and the atmosphere inside the wafer carrier 200 is discharged from the wafer carrier 200 in the horizontal direction.

Therefore, the atmosphere inside the wafer carrier 200 can be discharged efficiently by means of the wafer 40 in the wafer carrier 200 without interfering with the flow of discharged gas produced by the suction of the gas suction means 4, Thus, since the suction of the atmosphere inside the wafer carrier 200 is simultaneously performed with the introduction of $N_2$ gas, the atmosphere inside the wafer carrier 200 can be replaced efficiently in a short time.

Here, a lid with a fixed opening direction is used as the deflection means. However, the defection means is not limited thereto, but the deflection means may have adjusting means for adjusting the opening direction, whereby the gas-sucking direction is adjusted. For example, the deflection means wherein a driving source is installed on the lid, and the opening direction is automatically rotated for automatically adjusting the gas-sucking direction can be considered.

Also, although a lid 1 having an opening 1A to one direction is used here as the deflection means, the defection means is not limited thereto, but a lid having openings in a plurality of directions may also be used. Also, the deflection means is not limited to the lid, but the deflection means may be the other means for deflecting the direction of suction within the scope of the present invention.

Furthermore, although the deflection means is installed above the gas suction port 2 for preventing the interference of gas suction by the wafers 40 accommodated in the wafer carrier 200, such a deflection means may not be essential.

Also, in First Embodiment, although the gas supply means 5 is installed on the gas inlet 3, the present invention is not limited thereto, but the atmosphere in the clean room may be introduced directly into the wafer carrier 200 without using the gas supply means. Even in this case, since the pressure in the wafer carrier 200 is previously maintained negative, the outside air can be allowed to flow in the wafer carrier 200 using pressure difference with the outside air, and the atmosphere inside the wafer carrier 200 can be replaced easily. In this case, since no means for gas supply is used, the atmosphere inside the wafer carrier 200 can be replaced by easily using a simpler mechanism.

The gas inlet 3 may be provided with deflection means that can deflect the gas-flow direction. When such deflection means is installed, the gas-flow direction can be deflected to the direction not interfering with the gas flow by wafers or the like accommodated in the wafer carrier 200, and the gas can be introduced efficiently.

Also in First Embodiment, a gas suction port 2 is installed on the remote location from the carrier door 20 on the bottom of the wafer carrier 100 to face the carrier door 20, and two gas inlets 3 are installed in the vicinity of the carrier door 20 apart from each other. By thus installing the gas suction port 2 and the gas inlet 3 apart from each other, gases can be replaced efficiently. However, when at least one gas suction port and one gas inlet are installed, the selection of locations, and the number of gas suction ports and gas inlets are not limited thereto. For example, a wafer carrier 200 wherein a gas suction port is installed on the bottom of the wafer carrier 100 in the vicinity of the carrier door 20, and the gas inlet is installed on the remote location facing the carrier door 20; and a wafer carrier 100 wherein a gas suction port and a gas inlet are installed in the vicinity of the carrier door 20 apart from each other can be considered.

Furthermore, when a filter is installed on the bottom of the wafer carrier, the filter may be used as the gas suction port and the gas inlet.

Also, $N_2$ gas is used as the gas for replacing. This is because $N_2$ gas can inhibit the growth of natural oxide films as well as reactions; however, the present invention is not limited thereto, but other gases, such as dry air, may be used.

First Embodiment was described by exemplifying a preliminary washing apparatus as the wafer processing apparatus. In First Embodiment, wafers 40, on which removed a natural oxide film in preliminary washing, are accommodated in the wafer carrier 200, and thereafter, the whole atmosphere inside the wafer carrier 200 is surely and efficiently replaced. Thereby, the growth of natural oxide films on wafers 40 can be inhibited. Therefore, it is effective to replace the atmosphere inside the wafer carrier after preliminary washing.

However, the method for gas replacement described in First Embodiment is not limited to the gas replacement after preliminary washing, but can be used in various timing in the wafer-processing step, such as in the case where gases are replaced during the wafer carrier being stocked in a stocker for a rather long period of time, and in the case where gases are replaced for preventing organic contamination in the wafer carrier after the wafers whereto photoresist films are applied have been accommodated.

Second Embodiment

In Second Embodiment, as in First Embodiment, the atmosphere inside a wafer carrier is sucked to make pressure in the wafer carrier negative, and the atmosphere inside the wafer carrier is replaced. Furthermore, in Second Embodiment, a gas inlet is installed on a carrier door 20 of the wafer carrier to prevent foreign matter deposited on the bottom of the wafer carrier from blowing up, and to realize the efficient replacement of the atmosphere inside the wafer carrier.

Figure 6:
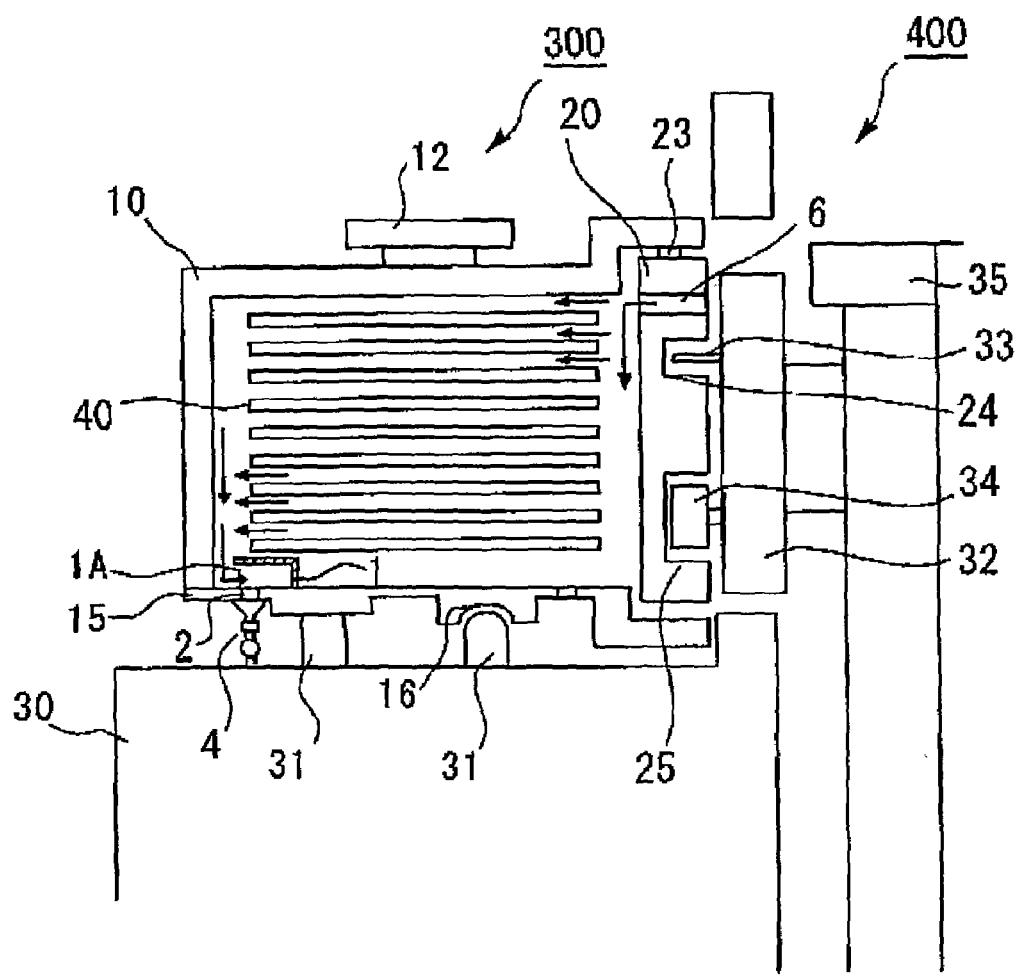
FIG. 6 is a sectional view illustrating a wafer carrier used in Second Embodiment placed on the table of a wafer processing apparatus.

FIG. 6 is a sectional view illustrating a wafer carrier used in Second Embodiment placed on the table of a wafer processing apparatus.

In FIG. 6, reference numeral 300 denotes the wafer carrier used in Second Embodiment, and 6 denotes a gas inlet installed on the carrier door 20 of the wafer carrier 300. A filter is installed on the gas inlet 6 to prevent foreign matter from mixing when a gas is introduced.

A gas suction port 2 is installed on the bottom of the wafer carrier 300 as in First Embodiment, and the gas suction port 2 is provided with a lid 1 as a deflection means.

The replacement of inside gas by using the wafer carrier 300 will be described below.

When the wafer carrier 300 is used, after the wafer carrier 300 is placed on a predetermined location on the table, gas suction means 4 is connected to the gas suction port 2. Thereafter, the suction of the atmosphere inside the wafer carrier 300 is started.

Here, no gas supply means is provided to the gas inlet 6. However, once the suction of the atmosphere inside the wafer carrier 300 is started, the pressure in the wafer carrier 300 becomes negative relative to the pressure in the clean room. Therefore, the atmosphere in the clean room flows into the wafer carrier 300 naturally without using any special means, whereby the atmosphere inside the wafer carrier 300 can be replaced.

Since other parts are identical to the parts in First Embodiment, description thereof will be omitted.

By doing this, $N_2$ gas for replacing can be introduced through the gas inlet 6 installed on the side of the carrier door 20. Therefore, it is not required to flow $N_2$ gas from the bottom to upward, and foreign matter deposited on the bottom is not blown up as in case of flowing the gas from the bottom of the wafer carrier. Therefore, the gas in the wafer carrier 300 can be replaced surely and efficiently, and the inside of the wafer carrier 300 can be maintained in a clean state.

Here, the case where the gas inlet 6 is installed on the carrier door 20 is described. However, the present invention is not limited thereto, but the same effect can be obtained when the gas inlet is installed on the side or the upper surface of the carrier shell 10.

In Second Embodiment, the gas in the wafer carrier 300 is replaced by flowing the atmosphere in the clean room into the wafer carrier 300 without providing any special gas supply means to the gas inlet 6. According to this method, no large-scale gas supply means is required, and the atmosphere inside the wafer carrier 300 can be replaced more easily. However, the present invention is not limited thereto, but, for example, gas supply means for supplying high-purity $N_2$ gas can be connected to the gas inlet, and thereby the atmosphere inside the wafer carrier 300 can be replaced.

Third Embodiment

In Third Embodiment, the replacement of the atmosphere inside the wafer carrier is performed in a stocker for stocking a wafer carrier accommodating wafers. The stocker used in Third Embodiment is provided with a mechanism for replacing the atmosphere inside the wafer carrier.

Figure 7:
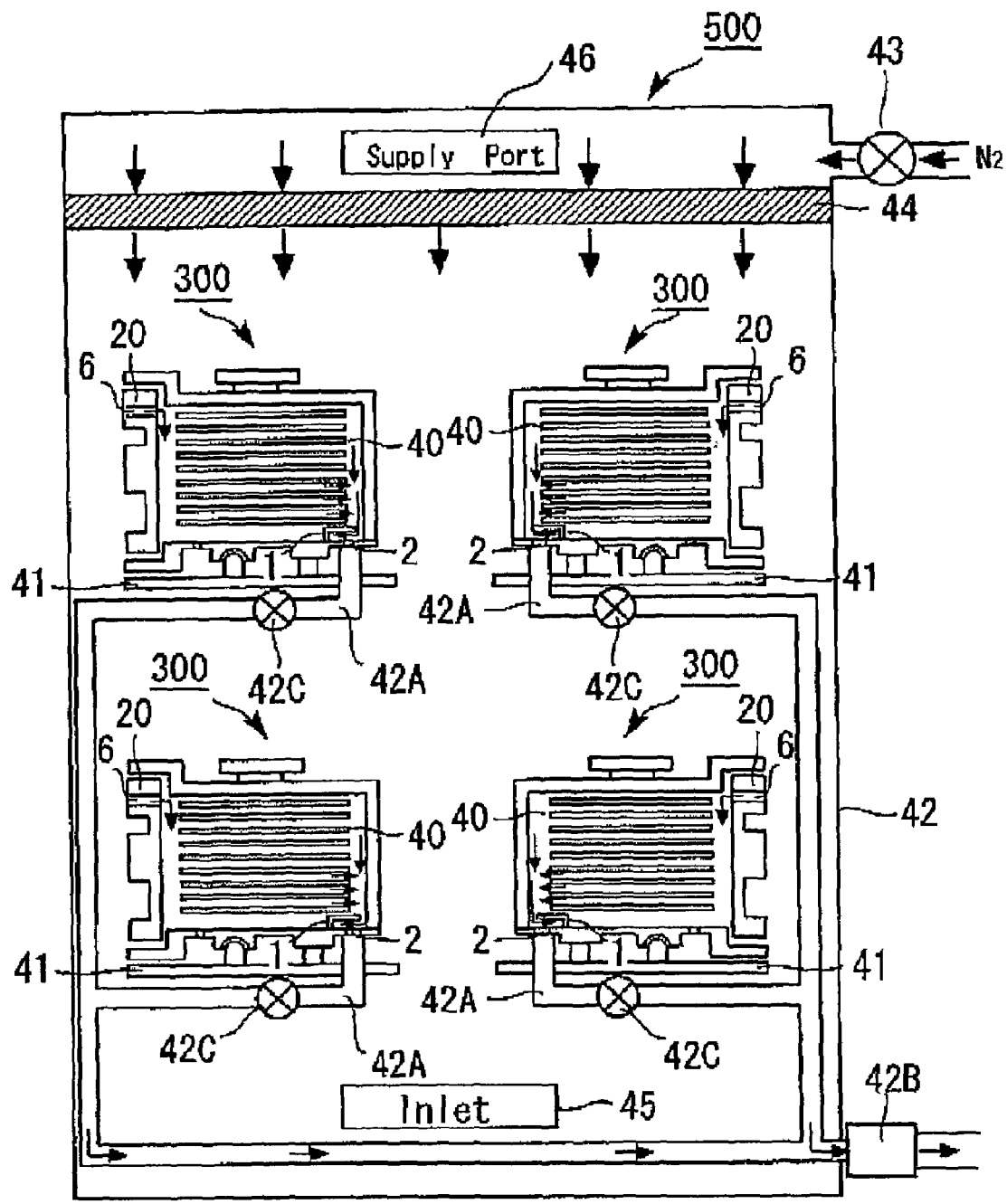
FIG. 7 is a schematic diagram illustrating an inside of a stocker used in Third Embodiment.

FIG. 7 is a schematic diagram illustrating an inside of a stocker used in Third Embodiment of the present invention.

In FIG. 7, reference numeral 500 denotes a stocker for accommodating wafer carriers 300. In the stocker 500, wafers 40 are stocked together with wafer carriers 300 in the state where wafers 40 are accommodated in wafer carriers 300.

Reference numeral 41 denotes table portions installed in the stocker 500. A water carrier 300 to be stocked in the stocker 500 is placed on each of the table portions 41.

Reference numeral 42A denotes a gas suction pipe to be connected to the gas suction port 2 of the wafer carrier 300, and 42B denotes a suction pump for sucking and discharging the atmosphere inside the wafer carrier 300 through the gas suction pipe 42A. Reference numeral 42C denotes a valve installed in the middle of each of the gas suction pipes 42A, which is opened when the gas is sucked.

The suction pipes 42A, the suction pump 42B, and the valves 42C constitute gas suction means 42.

Reference numeral 43 denotes gas supply means for supplying a gas for replacing the atmosphere inside the stocker 500, and 44 denotes a filter installed in the stocker 500. The supply means 43 supplies $N_2$ gas as the gas for replacing.

Reference numeral 45 denotes a suction port for sucking the atmosphere inside the stocker 500, and 46 denotes a supply port for supplying the atmosphere sucked by the suction port 45 to the upstream of the filter 44. Thereby, the atmosphere inside the stocker 500 is circulated in order to reduce the quantity of the $N_2$ gas.

Next, a method for gas replacement according to Third Embodiment will be described below.

First of all, wafer carriers 300 of the wafer 40 are placed on the table portions 41 of the stocker 500. $N_2$ gas is supplied from the gas supply means 43 into the stocker 500. The $N_2$ gas supplied from the gas supply means 43 passes through the filter 44 to remove foreign matter, and then passes through the area where wafer carriers 300 are stocked, and sucked from the suction port 45. The $N_2$ gas sucked from the suction port 45 is supplied to the upper portion of the filter 44 from the supply port 46, and supplied to the inside of the stocker 500.

Thereby, the atmosphere inside the stocker 500 is always replaced by the circulation of $N_2$ gas, and maintained in a clean state.

In this state, the replacement of the atmosphere inside the wafer carrier 300 is started.

First, suction pipes 42A are connected to the gas suction ports 2 of wafer carriers 300. Thereafter, valves 42C are opened, and the suction pump 42B is operated to start suction.

Thereby, the atmosphere inside the water carriers 300 is sucked from the gas suction ports 2, and the pressure in the wafer carriers 300 becomes negative relative to the atmospheric pressure in the stocker 500. When difference in pressures between the inside of the wafer carriers 300 and the stocker 500 occurs, $N_2$ gas filling the stocker 500 flows through the gas inlets 6 installed on the carrier doors 20, and the atmosphere inside the wafer carriers 300 is also replaced by $N_2$ gas.

Since other parts are identical to the parts in First Embodiment or Second Embodiment, description thereof will be omitted.

By doing this, even if a plurality of wafer carriers are stocked in a stocker, the atmosphere inside the wafer carriers can be replaced more efficiently at the same time. Normally, wafer carriers are stocked in the stocker for a relatively long time. Therefore, by utilizing this stock time, the gas inside the wafer carriers can be replaced without consuming any special time for replacing.

In Third Embodiment, wafer carriers 300 similar to the wafer carrier 300 in Second Embodiment are used as wafer carriers accommodated in the stocker 500. However, the present invention is not limited thereto, but other types of wafer carriers may also be used as long as the wafer carrier has a gas suction port that can be connected to the gas suction means 42 installed in the stocker 500, such as a wafer carrier having a gas inlet 3 installed on the bottom like the water carrier 200.

Here, $N_2$ gas is used as the gas supplied by the supply means 43. However, the present invention is not limited thereto, but other gases, such as dry air, may also be used.

The gas supplied from the supply means 43 to the stocker 500 is sucked through the inlet 45, and then supplied to the stocker 500 again through the supply port 46, and is circulated and used. By doing this, the quantity of the gas for replacing, such as $N_2$gas and dry air, can be reduced. However, the present invention is not limited to the use of circulated gas for replacing.

Although the supply means 43 of the stocker 500 replaces the whole atmosphere inside the stocker 500, the atmosphere inside the wafer carrier 300 can also be replaced by using clean $N_2$ gas or dry air filled in the stocker 500. However, the gas supply means is not limited thereto, but may also be installed Individually on the wafer carrier or the table portion. Furthermore, if the atmosphere inside the stocker 500 is in a clean state, such a supply means is not necessarily required.

In Third Embodiment, the gas suction means of the stocker 500 includes a suction pipe 42A, a suction pump 42B, and a valve 42C. However, the present invention is not limited to such a constitution, but may be any gas suction means that can be connected to the gas suction port of the wafer carrier to be stocked, and can suck the atmosphere inside the wafer carrier.

The features and the advantages of the present invention as described above may be summarized as follows.

According to one aspect of the present invention, when the atmosphere inside the wafer carrier is replaced by $N_2$ gas or dry air, the atmosphere inside the wafer carrier is previously sucked to maintain the pressure in the wafer carrier negative. Accordingly, the gas inside the wafer carrier can be replaced efficiently in a short time.

Thereby, the elevation of humidity and oxygen content in the wafer carrier, or the contamination of the wafer carrier by the mixing of organic solvents or foreign matter can be inhibited so as to maintain the atmosphere clean, and to prevent the growth of oxide films or the accumulation of organic contamination.

In another aspect, in the present invention, the external air may be introduced through a gas inlet by making the inside of the wafer carrier negative. Accordingly, even if no gas supply means are used, the atmosphere inside the wafer carrier can be replaced easily.

In another aspect, in a present invention, a gas inlet may be installed on the side of the wafer carrier of the present invention. Accordingly, the gas for replacing can be introduced into the wafer carrier without blowing up foreign matter deposited on the bottom of the wafer carrier. Therefore, the atmosphere inside the wafer carrier can be replaced more efficiently, and the wafer carrier can be maintained clean.

In another aspect, in a present invention, deflection means may be installed above the gas suction port. Accordingly, the sucking direction when the gas inside the wafer carrier is sucked can be deflected. Therefore, the atmosphere can be sucked without any interference by wafers or the like in the wafer carrier, and furthermore, the atmosphere inside the wafer carrier can be replaced efficiently in a short time.

In another aspect, in a present invention, the gas inside the wafer processing apparatus may be replaced while the wafer carriers are stocked in a stocker. Accordingly, the atmosphere inside the wafer carrier can be replaced efficiently without consuming special time for replacing the atmosphere inside the wafer carrier.

In another aspect, in a present invention, a stocker may be provided with a mechanism for replacing the atmosphere inside the wafer carrier. Accordingly, the atmosphere inside a plurality of wafer carriers can be replaced efficiently at the same time.

Obviously many modifications and variations of the present invention are possible in the light of the above teachings. It is therefore to be understood that within the scope of the appended claims the invention may by practiced otherwise than as specifically described.

The entire disclosure of Japanese Patent Applications No. 2001-233960, filed on Aug. 1, 2001 and No. 2001-213943, filed on Jul. 13, 2001, including specifications, claims, drawings and summaries, on which the convention priorities of the present application are based, are incorporated herein by reference in its entirety.

The invention claimed is:

1. A method of replacing atmosphere inside a wafer carrier by introducing a gas into an inside of said wafer carrier from a first gas inlet provided to the wafer carrier accommodating wafers, comprising the steps of:

placing a plurality of wafer carriers including said wafer carrier in a stocker;

sucking the atmosphere inside said wafer carrier to make the inside pressure negative relative to the outside atmosphere of said wafer carrier;

maintaining an inert atmosphere in the stocker; and letting an inert gas flow into an inside of said wafer carrier from said inert atmosphere in the stocker through a second inlet provided to said wafer carrier by said negative pressure of the wafer carrier.

2. A method of replacing atmosphere according to claim 1, wherein the step of sucking atmosphere is performed while a gas is introduced into inside said wafer carrier.

3. The method of replacing a atmosphere according to claim 1, wherein the step of the sucking atmosphere is performed by deflecting the direction of sucking atmosphere.

4. The method of replacing atmosphere according to claim 1, wherein the step of maintaining an atmosphere in the stocker is conducted by circulating inert gas by passing the inert gas through a filter, wherein the inert gas is inhaled from an intake which is different from said first gas inlet.

* * * * *